US009147573B2

(12) United States Patent
Tsubota (10) Patent No.: US 9,147,573 B2
(45) Date of Patent: Sep. 29, 2015

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventor: Yasutoshi Tsubota, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/769,505

(22) Filed: Feb. 18, 2013

(65) Prior Publication Data

US 2014/0057456 A1 Feb. 27, 2014

(30) Foreign Application Priority Data

Feb. 17, 2012 (JP) .................................. 2012-032682

(51) Int. Cl.
| | |
|---|---|
| *H01L 21/461* | (2006.01) |
| *H01L 21/02* | (2006.01) |
| *C23C 16/50* | (2006.01) |
| *H01L 21/321* | (2006.01) |

(52) U.S. Cl.
CPC .......... *H01L 21/02238* (2013.01); *C23C 16/50* (2013.01); *H01L 21/32105* (2013.01)

(58) Field of Classification Search
CPC .................................................. C23C 16/325
USPC ................................................. 438/771, 478
See application file for complete search history.

(56) References Cited

U.S. PATENT DOCUMENTS

| | | | | |
|---|---|---|---|---|
| 6,899,767 | B2 * | 5/2005 | Sakuma | 134/26 |
| 8,083,963 | B2 * | 12/2011 | Delgadino et al. | 216/67 |
| 2003/0207547 | A1 * | 11/2003 | Wang et al. | 438/478 |
| 2009/0169768 | A1 | 7/2009 | Ueda et al. | |
| 2010/0297832 | A1 * | 11/2010 | Imai et al. | 438/478 |
| 2012/0064734 | A1 * | 3/2012 | Takahashi | 438/795 |

FOREIGN PATENT DOCUMENTS

| | | |
|---|---|---|
| JP | 2002008999 A | 1/2002 |
| JP | 2007335608 | 12/2007 |
| JP | 2008091667 A | 4/2008 |
| JP | 2011018909 | 1/2011 |
| KR | 100900073 B1 | 5/2009 |

OTHER PUBLICATIONS

Office Action in corresponding Korean Application No. 10-2013-0016322, dated Jan. 24, 2014, along with an English translation.

* cited by examiner

*Primary Examiner* — Mary Wilczewski
*Assistant Examiner* — Damian A Hillman
(74) *Attorney, Agent, or Firm* — Edell, Shapiro & Finnan LLC (57) ABSTRACT

The substrate processing apparatus includes a process chamber; a susceptor configured to support a wafer; lifter pins configured to support the wafer on the susceptor; a gas supply unit configured to supply a gas into the process chamber; a heating unit configured to heat the wafer; an excitation unit configured to excite the gas supplied into the process chamber; an exhaust unit configured to exhaust the inside of the process chamber; and a controller. The controller controls a reducing gas to be supplied into the process chamber in a state in which the wafer is supported by the lifter pins, and controls the gas supply unit to supply an oxidizing gas and a reducing gas into the process chamber in a state in which the wafer is supported by the susceptor.

11 Claims, 5 Drawing Sheets

SUBSTRATE PROCESSING APPARATUS AND METHOD OF MANUFACTURING SEMICONDUCTOR DEVICE

CROSS REFERENCE TO RELATED APPLICATIONS

This application claims foreign priority under 35 U.S.C. §119(a)-(d) to Application No. JP 2012-032682 filed on Feb. 17, 2012, entitled "Substrate Processing Apparatus and Method of Manufacturing Semiconductor Device," the entire contents of which are hereby incorporated by reference.

FIELD OF THE INVENTION

The present invention relates to a substrate processing apparatus and a method of manufacturing a semiconductor device.

BACKGROUND

A conventional method of manufacturing a semiconductor device includes a process of processing a substrate on which a metal film and a polysilicon film are formed with plasma using a reducing gas and an oxidizing gas. With this process, the polysilicon film can be oxidized without oxidizing the metal film.

SUMMARY

In the conventional method of manufacturing a semiconductor device, a substrate to be processed may be unintentionally oxidized and one surface and another surface of the substrate may not be evenly heated. It is an object of the present invention to prevent a substrate to be processed from being unintentionally oxidized and one surface and another surface of the substrate to be processed from being unevenly heated.

According to one aspect of the present invention, there is provided a substrate processing apparatus comprising: a process chamber configured to process a substrate to be processed exposing a metal element-containing film and a silicon-containing film; a first substrate support unit disposed in the process chamber, and configured to support the substrate; a second substrate support unit disposed in the process chamber, and configured to support the substrate at a position higher than that of the first substrate support unit; a gas supply unit configured to supply a reducing gas and an oxidizing gas into the process chamber; a heating unit configured to heat the substrate; an excitation unit configured to excite the reducing gas and the oxidizing gas supplied into the process chamber; an exhaust unit configured to exhaust an inside of the process chamber; and a control unit configured to control the gas supply unit, the excitation unit and the exhaust unit so as to supply the reducing gas into the process chamber by the gas supply unit while heating the substrate by the heating unit with the second substrate support unit supporting the substrate, and to supply the oxidizing gas and the reducing gas into the process chamber by the gas supply unit while exciting the oxidizing gas and the reducing gas by the excitation unit with the first substrate support unit supporting the substrate.

DETAILED DESCRIPTION

A substrate processing apparatus and a method of manufacturing a semiconductor device according to one exemplary embodiment of the present invention will now be described below. The following description is provided merely to explain one exemplary embodiment of the present invention and the present invention is thus not limited thereto. Thus, it would be apparent to those of ordinary skill in the art that embodiments in which at least one of elements set forth in the exemplary embodiment is replaced with an equivalent thereof may be employed and the exemplary embodiment is to cover all such modifications, equivalents, and alternatives falling within the scope of the invention. For example, a number of substrates to be simultaneously processed, a direction in which a substrate that is to be processed is supported, a treatment temperature, a shape of a process chamber, a method of exciting a gas, and the like are not limited to those described below as examples.

In the following description, the present invention will be described with respect to a substrate processing apparatus according to an embodiment of the present invention that includes a substrate process furnace that is a type of a plasma treatment furnace and configured to plasma-treat a substrate to be processed, e.g., a wafer, using a modified magnetron typed plasma source capable of generating high-concentration plasma with an electric field and a magnetic field (hereinafter referred to as an 'MMT apparatus'). In the MMT apparatus described below, a magnetron discharge is generated by installing a substrate in a process chamber that is air-tightly sealed, interposing a shower head between the substrate and the process chamber to introduce a reactive gas into the process chamber, maintaining the process chamber under constant pressure, and supplying high-frequency power to a discharging electrode to simultaneously form an electric field and a magnetic field. Also, the MMT apparatus becomes a long-lived power source to increase occurrence of electrolytic dissociation when electrons emitted from the discharging electrode continuously make a cycloidal motion while drifting to rotate, thereby generating high-concentration plasma. Also, the MMT apparatus may perform diffusion treatment by oxidizing or nitriding a surface of a substrate to be processed by exciting and decomposing a reactive gas. The MMT apparatus may further perform various plasma treatments, such as thin film formation or surface etching, on a substrate to be processed.

Figure 1:
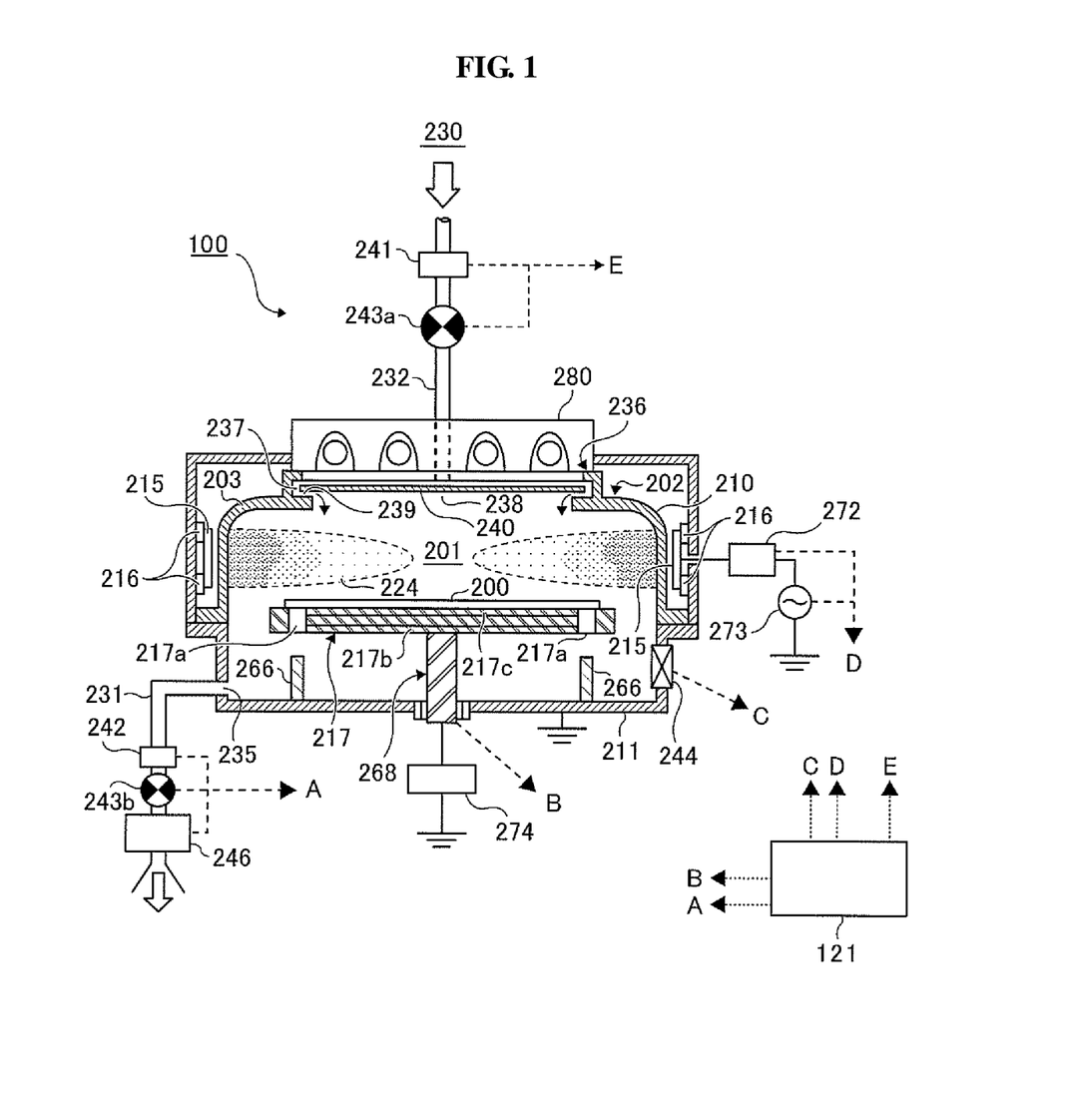
FIG. 1 is a cross-sectional view of a substrate processing apparatus according to an embodiment of the present invention.

FIG. 1 is a cross-sectional view of a substrate processing apparatus 100 according to an embodiment of the present invention. The substrate processing apparatus 100 is configured to process a wafer 200 used as a substrate to be processed, and includes a process furnace 202 that is an MMT apparatus as described above and that includes a process container 203. An inner space of the process furnace 202 is used as a process chamber 201. In the process chamber 201, the wafer 200 on which, for example, a metal element-containing film and a silicon-containing film are exposed is processed. The metal element-containing film exposed on the wafer 200 contains, for example, at least one of tungsten, tantalum, titanium nitride, tungsten nitride, and ruthenium. The silicon-containing film exposed on the wafer 200 contains, for example, at least one of a poly-Si film, an amorphous silicon film, a silicon film, and a silicon oxide film.

The process container 203 includes an upper container 210 that is used as a first container and is, for example, a dome-type container, and a lower container 211 that is used as a second container and is, for example, a bowl type container. The upper container 210 is formed to cover an upper surface of the lower container 211. The upper container 210 is formed of a non-metal material, such as aluminum oxide or quartz, and the lower container 211 is formed of aluminum. A susceptor 217 which will be described below is formed of a non-metal material, such as aluminum nitride, ceramic, or quartz, in addition to forming the upper container 210 with a non-metal material and forming the lower container 211 with aluminum. Thus, contamination of metal in a film of the wafer 200 to be processed, i.e., the wafer 200, during processing of the wafer 200 may be reduced.

The substrate processing apparatus 100 further includes a shower head 236. The shower head 236 is installed above the process chamber 201, and includes a cap-type lid 233, a gas inlet 234, a buffer chamber 237, an opening 238, a shielding plate 240, and a gas outlet 239. The buffer chamber 237 is used as a space for dispersing a gas introduced via the gas inlet 234. A gas supply pipe 232 is connected to the gas inlet 234 to supply a gas. The gas supply pipe 232 is connected to a gas cylinder (not shown) configured to store a reactive gas 230 via a valve 243a which is a switch valve and a mass flow controller 241 used as a flow rate controller and flow rate control means. The shower head 236 is used to supply the reactive gas 230 into the process chamber 201.

Also, in the substrate processing apparatus 100, a gas exhaust port 235 that exhausts a gas is formed on a sidewall of the lower container 211 so that a gas generated after processing of the wafer 200 may flow from the circumference of the susceptor 217 (which will be described below) in a direction lower than the process chamber 201. The gas exhaust port 235 is connected to a gas exhaust pipe 231 configured to exhaust a gas. The gas exhaust pipe 231 is connected to a vacuum pump 246 used as an exhaust apparatus via an auto pressure controller (APC) 242 used as a pressure adjustor and a valve 243b used as a switch valve.

The substrate processing apparatus 100 further includes a container-shaped electrode 215 used as a discharging mechanism and discharging means for exciting the reactive gas 230 supplied thereto. The container-shaped electrode 215 is installed around an outer circumference of the process container 203 and is arranged to surround a plasma generation region 224 in the process chamber 201. The container-shaped electrode 215 is connected to a high-frequency power source 273 that supplies high-frequency power, via an impedance matching device 272 that performs impedance matching.

The substrate processing apparatus 100 further includes container-shaped magnets 216. The container-shaped magnets 216 have a container shape, are each used as not only a magnetic field forming mechanism but also magnetic field forming means, and are formed, for example, as permanent magnets. Specifically, the upper container-shaped magnet 216 and the lower container-shaped magnet 216 are disposed at upper and lower ends of an external surface of the container-shaped electrode 215, respectively. Each of the upper and lower container-shaped magnets 216 and 216 has a magnetic pole at both ends (inner circumference and outer circumference) thereof in a radial direction of the process chamber 201, such that directions of the magnetic poles of the upper and lower container-shaped magnets 216 and 216 are opposite each other. Thus, the magnetic poles of the upper and lower container-shaped magnets 216 and 216 at the inner circumferences thereof are different poles, thereby forming a magnetic field line along an inner circumferential surface of the container-shaped electrode 215 in a cylindrical axial direction.

The process furnace 202 may be used to process the wafer 200 using a magnetron discharge in a magnetron-type plasma source, may include, for example, the process chamber 201, the process container 203, the susceptor 217, the container-shaped electrode 215, the container-shaped magnet 216, the shower head 236, and the exhaust port 235 described above, and can plasma-treat the wafer 200 within the process chamber 201.

The substrate processing apparatus 100 further includes a shielding plate (not shown). The shielding plate is disposed near the container-shaped electrode 215 and the container-shaped magnets 216, and blocks an electric field or a magnetic field generated by the container-shaped electrode 215 and the container-shaped magnet 216 so that an external environment or apparatuses, such as another process furnace, may not be negatively influenced by the electric field or the magnetic field.

The substrate processing apparatus 100 further includes the susceptor 217 installed in the process chamber 201 and used as a first substrate support unit configured to support the wafer 200. The susceptor 217 may also be used as a heating unit for heating the wafer 200. In the susceptor 217, an electrode 217c that changes an impedance is installed and is grounded via an impedance varying mechanism 274. The impedance varying mechanism 274 includes a coil or a variable condenser, and is configured to control an electric potential of the wafer 200 via the susceptor 217 by adjusting a number of turns of the coil or a capacitance of the variable condenser.

The susceptor 217 is disposed at a lower central portion of the process chamber 201. The susceptor 217 is formed of, for example, a non-metal material, such as aluminum nitride, ceramic, or quartz, and a heater 217b is embedded in the susceptor 217 such that the heater 217b and the susceptor 217 are integrated together, thereby enabling the susceptor 217 to heat the wafer 200. More specifically, the susceptor 217 is configured to heat the wafer 200 to, for example, about 700° C. As described above, the susceptor 217 is used as a heating mechanism and heating means for heating the wafer 200. Also, through-holes 217a are formed in the susceptor 217.

In addition to the use of the susceptor 217 as a heating mechanism and heating means for heating the wafer 200, for example, a heating lamp 280 may be installed in the process chamber 201 to install heating means for heating the wafer 200 in the process chamber 201. In other words, in the substrate processing apparatus 100, a heating unit configured to heat the wafer 200 may be installed in at least one of the susceptor 217 used as the first substrate support unit and the process chamber 201.

If the heating unit is installed in the susceptor 217, a gas may be heated between the susceptor 217 and the wafer 200 and then be provided onto a surface of the wafer 200 when the wafer 200 is heated while being supported by lifter pins 266 which will be described below, thereby evenly heating the wafer 200. Furthermore, since in this case, a gas, the degree of activation of which increases due to an increase in the temperature thereof, is supplied onto a lower surface of the wafer 200, even the lower surface of the wafer 200 may be appropriately processed.

When the heating unit is installed in the process chamber 201, gases, e.g., a reducing gas and an oxidizing gas, that are present in the process chamber 201 may be heated to improve the degrees of activation of the gases. When the heating unit is installed in both the susceptor 217 and the process chamber 201, an upper surface and a lower face of the wafer 200 may be simultaneously heated, thereby reducing the difference between the temperatures of the upper and lower surfaces of the wafer 200.

The substrate processing apparatus 100 further includes a susceptor elevating mechanism 268. The susceptor elevating mechanism 268 is used to move the susceptor 217 upward/downward.

The substrate processing apparatus 100 further includes, for example, three lifter pins 266. The lifter pins 266 are installed in the process chamber 201, and are used as a second substrate support unit for supporting the wafer 200 on the susceptor 217. The lifter pins 266 are arranged to pass through the through-holes 217a not in contact with the susceptor 217 when the susceptor 217 is moved downward by the susceptor elevating mechanism 268.

The substrate processing apparatus 100 further includes a gate valve 244. The gate valve 244 is installed on a sidewall of the lower container 211 and is used as a partition valve. The gate valve 244 is configured to load the wafer 200 into or unload the wafer 200 from the process chamber 201 by a transfer mechanism (not shown), when the gate valve 244 is open. Also, the gate valve 244 enables the process chamber 201 to be air-tightly closed.

The substrate processing apparatus 100 further includes a controller 121. The controller 121 controls the APC 242, the valve 243b, and the vacuum pump 246 through a signal line A, controls the susceptor elevating mechanism 268 through a signal line B, controls the gate valve 244 through a signal line C, controls the impedance matching device 272 and the high-frequency power source 273 through a signal line D, controls the mass flow controller 241 and the valve 243a through a signal line E, and controls the heater 217b embedded in the susceptor 217, the impedance varying mechanism 274, or the like through a signal line (not shown).

In the substrate processing apparatus 100 configured as described above, the susceptor 217 is installed in the process chamber 201 and used as the first substrate support unit for supporting the wafer 200, and the lifter pins 266 are installed in the process chamber 201 and used as the second substrate support unit for supporting the wafer 200 on the susceptor 217 as described above. Also, in the substrate processing apparatus 100, for example, the mass flow controller 241, the valve 243a, the valve 243b, and the shower head 236 are used as a gas supply unit. The gas supply unit supplies, for example, an oxidizing gas, a nitrogen-containing gas, and a reducing gas to the process chamber 201 as will be described below. Here, the oxidizing gas means a gas containing at least one of oxygen ($O_2$), nitrous oxide (NO), nitrogen dioxide ($NO_2$), ozone ($O_3$), hydrogen peroxide ($H_2O_2$), water ($H_2O$), etc. The nitrogen-containing gas means a gas containing at least one of nitrogen ($N_2$), ammonia ($NH_3$), etc. The reducing gas means a gas containing at least one of hydrogen ($H_2$), ammonia ($NH_3$) and carbon monoxide (CO). An oxygen-containing gas preferably means a gas containing oxygen in a gaseous state at normal temperature and under normal pressure. The reducing gas may be a hydrogen-containing gas.

Also, in the substrate processing apparatus 100, the susceptor 217 is used as a heating unit for heating the wafer 200, and the container-shaped electrode 215, the container-shaped magnet 216, the high-frequency power source 273, and the like are used as an excitation unit for exciting a gas in the process chamber 201 as described above. Also, in the substrate processing apparatus 100, the gas exhaust pipe 231, the vacuum pump 246, and the like are used as an exhaust unit for exhausting the inside of the process chamber 201. The controller 121 is also used as a control unit for controlling a gas supply unit including at least one of the susceptor elevating mechanism 268, the mass flow controller 241, etc., a heating unit including, for example, the susceptor 217, an excitation unit including the high-frequency power source 273, etc., and an exhaust unit including the vacuum pump 246, etc.

In the substrate processing apparatus 100 configured as described above, a predetermined plasma treatment may be performed on a surface of the wafer 200 or a surface of an underlying film formed on the surface of the wafer 200, as a process of processes of manufacturing a semiconductor device. The plasma treatment is performed by controlling the elements of the substrate processing apparatus 100 by the controller 121, as will be described in detail below.

Specifically, the wafer 200 is loaded into the process chamber 201 and is transferred onto the susceptor 217 by the transfer mechanism for transferring the wafer 200 from the outside of the process chamber 201. In this case, the susceptor 217 is moved downward to a position to which the wafer 200 is transferred, front ends of the lifter pins 266 then pass through the through-holes 217a in the susceptor 217, and the lifter pins 266 thus protrude by a predetermined height from a surface of the susceptor 217. Then, the gate valve 244 installed at the lower container 211 is opened, and the wafer 200 is placed at the front ends of the lifter pins 266 by the transfer mechanism. Then, the transfer mechanism is retreated to the outside of the process chamber 201, and the gate valve 244 is then closed. Then, the susceptor 217 is moved upward by the susceptor elevating mechanism 268 to place the wafer 200 on an upper surface of the susceptor 217, and is then moved upward again to a position at which the wafer 200 is to be processed.

In this case, the heater 217b embedded in the susceptor 217 is preheated, and heats the wafer 200 unloaded from the process chamber 201 to a predetermined temperature, e.g., a range of room temperature to 700° C. Pressure in the process chamber 201 is maintained to be equal to a predetermined pressure, for example, within a range of 0.1 to 1,000 Pa, using the vacuum pump 246 and the APC 242.

After the temperature of the wafer 200 reaches a predetermined process temperature and is then stabilized, a process gas, such as oxygen gas, nitrogen gas, or a rare gas, is introduced toward an upper surface (surface to be plasma-treated) of the wafer 200 placed in the process chamber 201 from the gas inlet 234 via the gas outlet 239 installed at the shielding plate 240. In this case, the introduced process gas has a predetermined flow rate ranging from 1 to 10,000 sccm. Predetermined high-frequency power ranging from, for example, 10 to 3,000 W is supplied to the container-shaped electrode 215 from the high-frequency power source 273 via the impedance matching device 272, for example, simultaneously with the introduction of the process gas. An impedance of a circuit to which high-frequency power is supplied is controlled to be a desired impedance by the impedance varying mechanism 274.

When a voltage is applied to the container-shaped electrode 215, a magnetron discharge occurs due to magnetic fields generated from the upper and lower container-shaped magnets 216 and 216, and electric charges are then trapped in a space above the wafer 200, thereby generating high-concentration plasma in the plasma generation region 224. Then, a surface of the wafer 200 on the susceptor 217 is plasma-treated using the high-concentration plasma. The wafer 200 that undergoes the plasma treatment is transferred to the outside of the process chamber 201 by the transfer mechanism in an order opposite to the order in which the wafer 200 was loaded into the process chamber 201.

Figure 2:
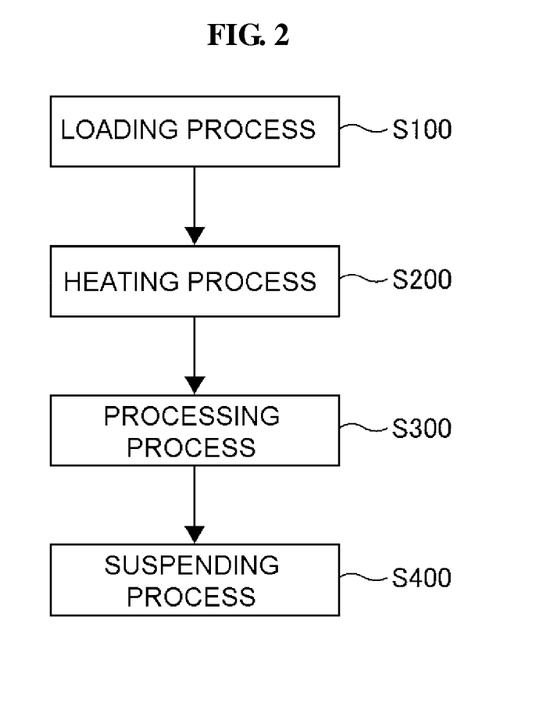
FIG. 2 is a flowchart illustrating a process of manufacturing a semiconductor device using the substrate processing apparatus of FIG. 1.

FIG. 2 is a flowchart illustrating a process of a method of manufacturing a semiconductor device using the substrate processing apparatus 100 of FIG. 1 according to an embodiment of the present invention. In the process illustrated in FIG. 2, a first step S100 is a loading process, in which the controller 121 controls the transfer mechanism to load the wafer 200 into the process chamber 201.

A second step S200 is a heating process, in which the controller 121 controls the elements of the substrate processing apparatus 100 to heat the wafer 200. The heating process includes controlling, for example, the transfer mechanism to place the wafer 200 on the lifter pins 266, controlling, for example, the vacuum pump 246 to exhaust the inside of the process chamber 201, controlling, for example, the valve 243a to supply a reducing gas into the process chamber 201, and heating the wafer 200 by, for example, the susceptor 217. For example, hydrogen gas is used as the reducing gas. Parts or all of the step of supplying the reducing gas into the process chamber 201 and the step of heating the wafer 200 are performed simultaneously.

In the heating process, the wafer 200 is heated while supplying the reducing gas into the process chamber 201. Thus, the wafer 200 is prevented from being oxidized, thereby suppressing undesired oxidation of a metal element-containing film formed on the wafer 200. Also, in the heating process, the wafer 200 is heated while being supported by the lifter pins 266. Thus, upper and lower surfaces of the wafer 200 are more evenly heated than when the wafer 200 is heated while being supported by the susceptor 217 including the heater 217b. Also, since the wafer 200 is supported by the lifter pins 266, a space is formed below the lower surface of the wafer 200 and the reducing gas is also supplied to this space. By supplying the reducing gas to the back of the wafer 200 as described above, oxygen elements attached to the lower surface of the wafer 200 may be removed. Thus, undesired oxidization of the metal element-containing film formed of the surface of the wafer 200 due to a small amount of oxygen emitted from the back of the wafer 200 may be prevented.

The upper and lower surfaces of the wafer 200 may be more evenly heated by installing a heating lamp (not shown) as additional heating means in the process chamber 201, in addition to the heater 217b installed in the susceptor 217. The reducing gas remaining in the process chamber 201 may be directly heated by radiating thermal energy onto a space in the process chamber 201. Also, since a member installed in the process chamber 201 or a surface of an inner wall thereof may be heated, the efficiency of reaction between oxygen elements attached to the member in the process chamber 201 or the surface of the inner wall thereof and the reducing gas may be improved, thereby increasing the efficiency of removing the oxygen elements.

A third step (S300) is a processing process, in which the controller 121 controls the elements of the substrate processing apparatus 100 to process the wafer 200. The processing process includes controlling, for example, the susceptor elevating mechanism 268 to place the wafer 200 on the susceptor 217, controlling, for example, the susceptor 217 to heat the wafer 200, controlling, for example, the valve 243a to supply an oxidizing gas and a reducing gas into the process chamber 201, and controlling, for example, the high-frequency power source 273 to excite the oxidizing gas and the reducing gas supplied into the process chamber 201. In this case, the oxidizing gas is an oxygen-containing gas and the reducing gas is a hydrogen-containing gas. That is, in step S300, oxygen gas and hydrogen gas may be supplied into the process chamber 201.

A fourth step S400 is a suspending process, in which the controller 121 suspends gas supply. The suspending process includes suspending the supply of the oxidizing gas and suspending the supply of the reducing gas after the supply of the oxidizing gas is suspended. The oxidizing gas is likely to oxidize the wafer 200 even in a non-excited state. Thus, in the suspending process, first, undesired oxidization of the wafer 200 is suppressed by suspending the supply of oxygen to lower the concentration of the oxidizing gas in the process chamber 201. Also, since excited hydrogen remains in the process chamber 201 longer than excited oxygen or non-excited oxygen gas, even if the metal element-containing film formed on the wafer 200 is oxidized, the oxidized metal element-containing film is reduced.

Figure 3:
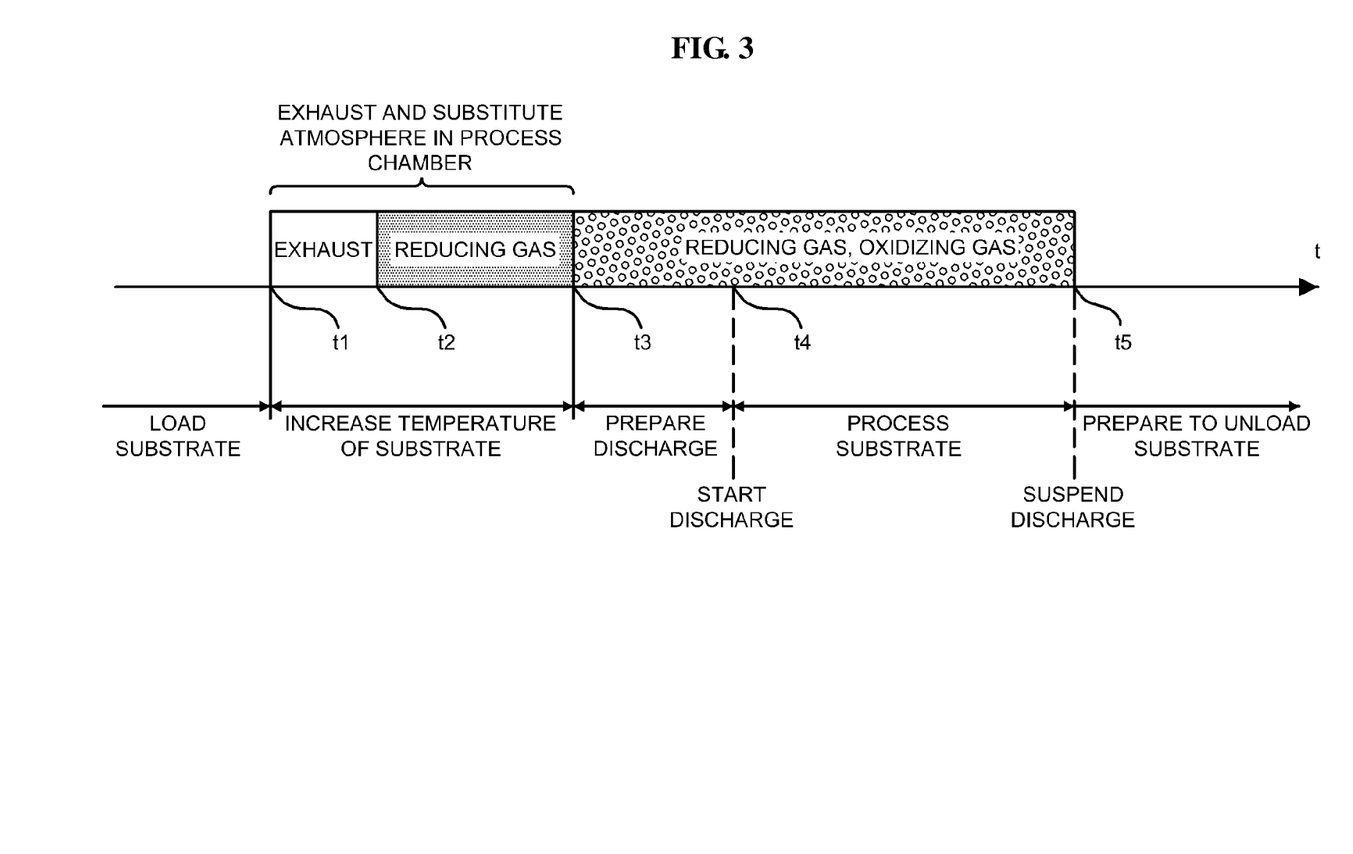
FIG. 3 illustrates a sequence of the process of manufacturing a semiconductor device illustrated in FIG. 2.

FIG. 3 illustrates a sequence of the process of manufacturing a semiconductor device illustrated in FIG. 2. As illustrated in FIG. 3, after the wafer 200 is loaded into the process chamber 201, the inside of the process chamber 201 starts to be exhausted starting from a point of time t1, and is exhausted between the point of time t1 and a point of time t2. Also, a reducing gas, e.g., hydrogen gas, starts to be supplied into the process chamber 201 at the point of time t2, and is supplied into the process chamber 201 between the point of time t2 and a point of time t3. An atmosphere in the process chamber 201 is reduced and substituted during a period from the point of time t1 to the point of time t3 in which the inside of the process chamber is exhausted and the reducing gas is supplied into the process chamber 201. By exhausting the inside of the process chamber 201, a gas containing oxygen elements mixed in the process chamber 201 may be discharged. Also, by supplying a reducing gas to the process chamber in a state in which a vacuum degree of the process chamber 201 is increased, the reducing gas may be efficiently supplied to the heated susceptor 217 or a heating member present in the process chamber 201 and a large amount of a reducing gas, the degree of activation of which is high, may be generated. Thus, the efficiency of removing an oxidizing gas present in the process chamber 201 or oxygen elements attached to the wafer 200 may be improved.

Preparation of a discharge starts from the point of time t3, and the discharge, which is performed by the container-shaped electrode 215, starts at a point of time t4 and is suspended at a point of time t5. A reducing gas and an oxidizing gas are supplied into the process chamber 201 between the point of time t4 and a point of time t5. Starting from the point of time t5, unloading of the wafer 200 is prepared.

In the sequence described above, the exhausting of the inside of the process chamber 201 from the point of time t1 to the point of time t2 or the supply of the reducing gas into the process chamber 201 from the point of time t2 to the point of time t3 may be omitted, thereby simplifying the process of manufacturing a semiconductor device.

Figure 4:
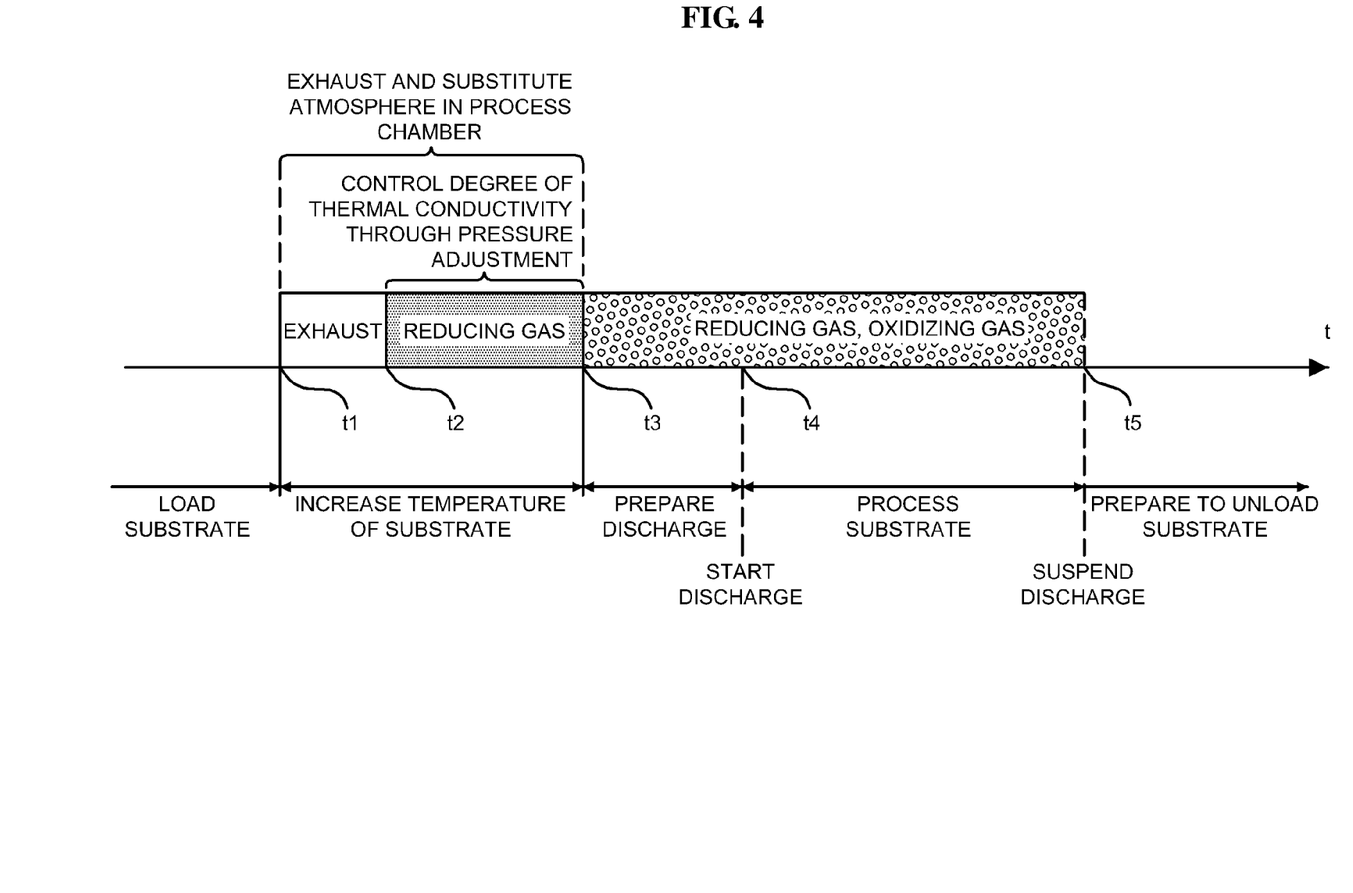
FIG. 4 illustrates a first modified example of the sequence of the process of manufacturing a semiconductor device illustrated in FIG. 2.

FIG. 4 illustrates a first modified example of the sequence of the process of manufacturing a semiconductor device illustrated in FIG. 3. In the sequence of FIG. 3, pressure in the process chamber 201 is not adjusted when the reducing gas is supplied into the process chamber 201 between the point of time t2 and the point of time t3. In contrast, in the sequence of FIG. 4, pressure in the process chamber 201 is adjusted when the reducing gas is supplied into the process chamber 201 between a point of time t2 and a point of time t3, thereby controlling a degree of thermal conductivity delivered to the wafer 200 and a degree of heating of the wafer 200, caused by the reducing gas. The pressure in the process chamber 201 is set to be higher than, for example, that when the wafer 200 is transferred onto the susceptor 217, thereby improving an efficiency of heating the upper surface of the wafer 200.

In the sequence of FIG. 4, the wafer 200 begins to be thermally influenced by the process chamber 201 simultaneously with being transferred into the process chamber 201, at a point of time t1. In this case, it seems that a temperature change occurs to a greater degree at a portion of the wafer 200 facing the susceptor 217 including the heater 217b. Also, if a speed of increasing the temperature of the wafer 200 is excessively high when the wafer 200 is heated, excessive thermal stress may be applied to the wafer 200. In contrast, if the speed of increasing the temperature of the wafer 200 is low, a time period of processing the wafer 200 becomes longer. In the sequence of FIG. 4, the wafer 200 is supported by the lifter pins 266 such that the wafer 200 is spaced apart from the susceptor 217, and the degree of thermal conductivity delivered to the wafer 200 and the speed of increasing the temperature of the wafer 200, caused by the reducing gas are controlled by adjusting the pressure in the process chamber 201 when the reducing gas is supplied into the process chamber 201.

Also, in the sequence of FIG. 4, hydrogen is used as the reducing gas in the heating process S200. Since hydrogen has a higher thermal conductivity than another gas, an amount of the heat transferred to the wafer 200 when hydrogen is used as the reducing gas is greater than when another gas is used as the reducing gas. Thus, it is more efficient to adjust the degree of thermal conductivity to the wafer 200 by adjusting the pressure in the process chamber 201 when hydrogen is used as the reducing gas than when another gas is used as the reducing gas.

Although a case in which hydrogen gas is used as a reducing gas during a process of increasing the temperature of the wafer 200 has been described above, another gas may be used as the reducing gas. That is, when any type of a gas having a low molecular weight is used, the degree of thermal conductivity to the wafer 200 may be preferably controlled by adjusting the pressure in the process chamber 201.

Figure 5:
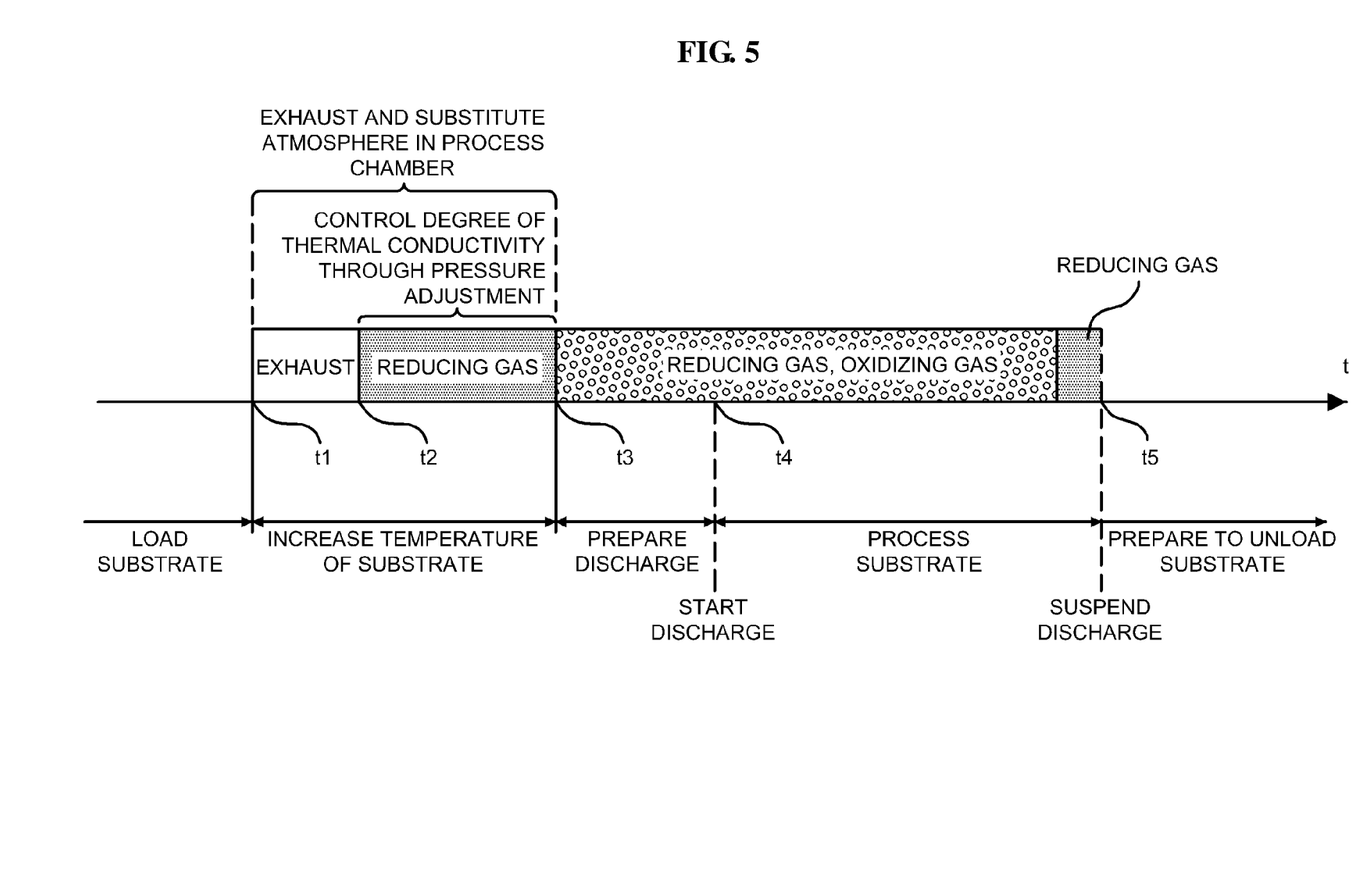
FIG. 5 illustrates a second modified example of the sequence of the process of manufacturing a semiconductor device illustrated in FIG. 2.

FIG. 5 illustrates a second modified example of the sequence of the process of manufacturing a semiconductor device illustrated in FIG. 3. In the sequence of FIG. 5, in addition to adjusting a pressure in the process chamber 201 when a reducing gas is supplied into the process chamber 201 between a point of time t2 and a point of time t3, supply of an oxidizing gas is suspended before a discharge is suspended in the container-shaped electrode 215 at a point of time t5, only a reducing gas is supplied into the process chamber 201 for a predetermined time period, and the supply of the reducing gas is suspended and the discharge in the container-shaped electrode 215 is suspended at the point of time t5.

A duration in which only the reducing gas is supplied into the process chamber 201 is determined by the volume of the process chamber 201, the speed of exhausting the process chamber 201, and the speed of supplying the reducing gas into the process chamber 201, e.g., one to thirty seconds, etc. Also, a flow rate of the reducing gas supplied into the process chamber 201 may be gradually reduced until the supply of the reducing gas is suspended at the point of time t5 or the discharge may be gradually reduced to be suspended in the container-shaped electrode 215 at the point of time t5.

The inventor of the present application conducted careful study and discovered that a superficial area of the wafer 200 increases when a plurality of fine convex structures including a metal element-containing film and a silicon-containing film are formed on the wafer 200 and a portion of the metal element-containing film is likely to be oxidized. Also, when the plurality of fine convex structures are formed, thermal stress is likely to be applied to the wafer 200. When the wafer 200 described above is used, the wafer 200 may be prevented from being bent due to thermal stress applied thereto and the metal element-containing film formed on the wafer 200 may be prevented from being oxidized by heating the wafer 200 in a state in which the wafer 200 is supported by the lifter pins 266 while the reducing gas is supplied into the process chamber 201 as described above.

In addition to the sequence of FIG. 5 described above, after the wafer 200 is processed with excited hydrogen and excited oxygen, excited hydrogen or a reducing gas may be supplied to a lower side of the wafer 200 in a state in which the wafer 200 is held by the lifter pins 266 while the supply of the oxidizing gas is suspended. By supplying active hydrogen to the lower side of the wafer 200 after the processing of the wafer 200, oxygen elements attached to a lower surface of the wafer 200 or a surface of the susceptor 217 may be removed and a film formed on an upper surface of the wafer 200 may be prevented from being oxidized due to the oxygen elements separated from the lower surface of the wafer 200 or the surface of the susceptor 217 during a process of unloading the wafer 200. Also, even when oxygen elements are attached to such a surface, oxygen may be easily removed by processing end edges of a surface of the susceptor 217, the upper or lower surface of the wafer 200, an inner wall of the process chamber 201, a surface of a member installed in the process chamber 201, and the like with hydrogen.

In accordance with the present invention, a substrate to be processed can be prevented from being unintentionally oxidized and one surface and another surface of the substrate to be processed can be prevented from being unevenly heated.

The above embodiment is described as to an example wherein the first substrate support supports the substrate by moving upward, and the second substrate support supports the substrate by moving downward. However, the present invention is not limited thereto, and, for example, the second substrate support may be configured to support the substrate by moving upward.

It is possible that one of the first substrate support and the second substrate support is movable relative to the other. Further, it is also possible that both of the first substrate support and the second substrate support are movable in a manner that a relative displacement may occur between the first substrate support and the second substrate support.

The present invention further includes the following supplementary notes as claimed in the claims of the present application.

Supplementary Note 1

According to the present invention, there is provided a substrate processing apparatus including: a process chamber configured to process a substrate to be processed exposing a metal element-containing film and a silicon-containing film; a vertically movable first substrate support unit disposed in the process chamber, and configured to support the substrate by moving upward; a second substrate support unit disposed in the process chamber, and configured to support the substrate at a position higher than that of the first substrate support unit when the first substrate support unit is lowered; a gas supply unit configured to supply a reducing gas and an oxidizing gas into the process chamber; a heating unit configured to heat the substrate; an excitation unit configured to excite the reducing gas and the oxidizing gas supplied into the process chamber; an exhaust unit configured to exhaust an inside of the process chamber; and a control unit configured to control the gas supply unit, the excitation unit and the exhaust unit so as to supply the reducing gas into the process chamber by the gas supply unit while heating the substrate by the heating unit with the second substrate support unit supporting the substrate, and to supply the oxidizing gas and the reducing gas into the process chamber by the gas supply unit while exciting the oxidizing gas and the reducing gas by the excitation unit with the first substrate support unit supporting the substrate.

Supplementary Note 2

The substrate processing apparatus of Supplementary Note 1, wherein the heating unit is installed in at least one of the first substrate support unit and the process chamber.

Supplementary Note 3

According to the present invention, there is provided a method of manufacturing a semiconductor device, including: (a) loading into a process chamber a substrate to be processed exposing a metal element-containing film and a silicon-containing film; (b) heating the substrate; and (c) processing the substrate, wherein the step (b) includes: (b-1) placing the substrate on a second substrate support unit; (b-2) exhausting an inside of the process chamber using an exhaust unit; (b-3) supplying a reducing gas into the process chamber using a gas supply unit; and (b-4) heating the substrate using a heating unit, and the step (c) includes: (c-1) placing the substrate on a first substrate support unit by moving the first substrate support unit upward; (c-2) heating the substrate placed on the first substrate support unit using the heating unit; (c-3) supplying an oxidizing gas and the reducing gas into the process chamber using the gas supply unit; (c-4) exciting the oxidizing gas and the reducing gas using an excitation unit; and (c-5) exhausting the process chamber using the exhaust unit.

Supplementary Note 4

The method of Supplementary Note 3, further including (d) suspending the step (c-3), wherein the step (d) includes: (d-1) suspending a supply of the oxidizing gas; and (d-2) suspending a supply of the reducing gas after the supply of the oxidizing gas is suspended.

Supplementary Note 5

A method of processing a substrate, including: (a) loading into a process chamber a substrate to be processed exposing a metal film and a silicon film; (b) substituting an atmosphere in the process chamber with a reducing gas; and (c) introducing a reducing gas and an oxidizing gas into the process chamber after the step (b), and processing the substrate through a plasma discharge, wherein the step (b) includes controlling an amount of heat transferred from the reducing gas to the substrate by adjusting a inside pressure of the process chamber.

Supplementary Note 6

The method of Supplementary Note 5, further including (d) exhausting an inside of the process chamber before the step (b).

Supplementary Note 7

The method of Supplementary Note 5 or 6, further including (e) suspending the step (c), wherein the step (e) includes: (e-1) suspending an introduction of the oxidizing gas; and (e-2) suspending an introduction of the reducing gas and the plasma discharge after the step (e-1).

Supplementary Note 8

The method of any one of Supplementary Notes 5 to 7, wherein the reducing gas includes hydrogen gas.

Supplementary Note 9

The inside pressure of the process chamber during the step (b) is higher than that of the step (a).

Supplementary Note 10

The substrate includes a plurality of convex structures including a stacked structure of a metal element-containing film and a silicon-containing film.

Supplementary Note 11

The substrate is supported by a second substrate support unit during at least one of the steps (e-1) and (e-2).

What is claimed is:

1. A method of manufacturing a semiconductor device, comprising:
   (a) loading a substrate to be processed into a process chamber;
   (b) heating the substrate after (a); and
   (c) processing the substrate after (b),
   wherein (b) comprises:
      (b-1) placing the substrate on front ends of lifter pins configured to support the substrate at a position higher than that of an upper surface of a susceptor, wherein the susceptor and the lifter pins are provided inside the process chamber;
      (b-2) supplying a reducing gas into the process chamber using a gas supply unit while the substrate is placed on the front ends of the lifter pins; and
      (b-3) heating the substrate placed on the front ends of the lifter pins using a heating unit, and
   (c) comprises:
      (c-1) placing the substrate heated in (b) on the upper surface of the susceptor;
      (c-2) heating the substrate placed on the upper surface of the susceptor using the heating unit;
      (c-3) supplying an oxidizing gas and the reducing gas into the process chamber using the gas supply unit;
      (c-4) exciting the oxidizing gas and the reducing gas in the processing chamber using an excitation unit while the substrate is placed on the susceptor; and
      (c-5) exhausting the process chamber using an exhaust unit.

2. The method of claim 1, further comprising:
   (d) suspending the supplying of the oxidizing gas and the reducing gas after (c-4),
   wherein (d) comprises:
      (d-1) suspending a supply of the oxidizing gas; and
      (d-2) suspending a supply of the reducing gas after the supply of the oxidizing gas is suspended.

3. The method of claim 2, wherein the substrate is supported on the front ends of the lifter pins during at least one of (d-1) and (d-2).

4. The method of claim 1, wherein the reducing gas comprises hydrogen gas.

5. The method of claim 1, wherein the inside pressure of the process chamber during (b) is higher than that of (a).

6. The method of claim 1, wherein the substrate comprises a plurality of convex structures including a stacked structure of a metal element-containing film and a silicon-containing film.

7. The method of claim 4, wherein (b) further comprises:
   (b-4) exhausting an inside of the process chamber using the exhaust unit after (b-1).

8. The method of claim 1, wherein a space is formed below a lower surface of the substrate and the reducing gas is supplied to the lower surface of the substrate while performing (b).

9. The method of claim 1, wherein (b-3) further comprises:
heating the substrate placed on the front ends of the lifter pins from above and below the substrate.

10. The method of claim 9, wherein (b-3) further comprises:
heating the substrate from below the substrate by the susceptor while the susceptor is positioned below the front ends of the lifter pins.

11. The method of claim 1, wherein (b-2) further comprises:
supplying the reducing gas into the process chamber excluding the oxidization gas and without exciting the reducing gas using the excitation unit until (c-4).

* * * * *